United States Patent [19]
Driscoll

[11] Patent Number: 5,608,360
[45] Date of Patent: Mar. 4, 1997

[54] OSCILLATOR FORMED OF HIGH FREQUENCY RESONATORS AND METHOD OF GENERATING HIGH FREQUENCY OSCILLATOR SIGNAL HAVING REDUCED VIBRATION SENSITIVITY AND PHASE NOISE AND IMPROVED LOOP GROUP DELAY

[75] Inventor: Michael M. Driscoll, Ellicott City, Md.

[73] Assignee: Northrop Grumman Corporation, Los Angeles, Calif.

[21] Appl. No.: 552,897

[22] Filed: Nov. 3, 1995

[51] Int. Cl.⁶ .................... H03B 5/00; H03B 5/30
[52] U.S. Cl. .................... 331/107 A; 331/108 B; 331/135
[58] Field of Search .................... 331/50, 57, 96, 331/107 A, 107 DP, 108 B, 116 R, 116 FE, 117 D, 158, 162, 135–137; 333/193

[56] References Cited

U.S. PATENT DOCUMENTS 4,590,442  5/1986  Saito et al. .................... 331/107 A
4,851,790  7/1989  Driscoll .................... 331/116 R
5,250,871  10/1993  Driscoll et al. .................... 310/348

Primary Examiner—David Mis
Attorney, Agent, or Firm—Philip A. Florenzo

[57] ABSTRACT

Multiple resonator stages are connected in series to form a closed loop. Each of these cascaded resonator stages includes at least a high frequency resonator and an amplifier. The amplifier amplifies the output of the high frequency resonator. Each stage also includes a power divider connected to the amplifier output. The power divider has at least two outputs. One of the two power divider outputs serves as an output of the oscillator formed by the cascaded resonator stages. The other output of the power divider is connected to the input of the next high frequency resonator stage. The oscillator further includes a phase shifter connected between two of the high frequency resonator stages to achieve a closed loop phase shift of N(360) degrees at the oscillator operating frequency, where N is an integer. The high frequency resonators may be acoustic resonators such as surface acoustic wave resonators (SAWR). In this manner, the method and oscillator generate at least one high frequency oscillator signal having previously unattainable phase noise characteristics.

20 Claims, 5 Drawing Sheets

| VIBRATION SENSITIVITY (PARTS IN $10^9$ PER g OF ACCELERATION) | | | |
|---|---|---|---|
| VIBRATION DIRECTION (FIGURE 4) | "X" | "Y" | "Z" |
| RESONATOR #1 | 2 | 3.5 | 50 |
| RESONATOR #2 | <0.5 | <0.5 | 55 |
| RESONATOR #3 | 5 | 5 | 43 |
| RESONATOR #4 | 2.5 | 3 | 48 |
| VIBRATION DIRECTION | "A" | "B" | "C" |
| OSCILLATOR WITH RESONATORS #1,2,3,4 | <0.5 | <0.5 | 3.5 |

OSCILLATOR FORMED OF HIGH FREQUENCY RESONATORS AND METHOD OF GENERATING HIGH FREQUENCY OSCILLATOR SIGNAL HAVING REDUCED VIBRATION SENSITIVITY AND PHASE NOISE AND IMPROVED LOOP GROUP DELAY

BACKGROUND OF THE INVENTION

1. Field of the Invention

The present invention relates to an oscillator formed of multiple cascaded high frequency resonator stages including at least one high frequency resonator, such as a surface acoustic wave resonator (SAWR), and signal amplification, and a method of generating at least one high frequency oscillator signal having reduced vibration sensitivity and phase noise and improved oscillator loop transmission response group delay.

2. Description of Related Art

Many application exist for oscillators including, for example, radar applications wherein the oscillator generates the transmitter and receiver local oscillator (L.O.) drive signals in the radar system. Applications such as radar systems have low noise requirements since low noise transmitter and receiver L.O. signals improve detection of low-cross section and low-velocity targets.

When used as oscillator frequency control elements, acoustic resonators such as a quartz crystal bulk acoustic wave resonators (BAWR) and surface acoustic wave resonators (SAWR) impart a certain amount of self noise to the oscillator output signals. The self noise is due in large part to imperfections in the crystal and the electrode metalization used to form a resonator from the crystal. Additionally, this self noise is dependent upon the amount of external vibration imparted to the resonator. In airborne or shipborne applications, the vibrations experienced by such crystal based resonators can increase noise levels to where oscillator signal spectrum degrades by as much as 40 dB.

The self noise of an oscillator generally includes amplitude modulated noise components and frequency or phase modulated noise components from the resonator and an amplifier used in the sustaining stage portion of the oscillator. The amplitude modulated noise components are easily accounted for; consequently, most noise reduction techniques focus on reducing the frequency or phase modulated noise components.

FIG. 9 illustrates the frequency spectrum of an output signal having a frequency $f_0$ from a conventional oscillator having a crystal resonator. The sloping and horizontal lines occurring symmetrically on either side of the line at frequency $f_0$ (referred to as "the carrier") represent the noise due to frequency or phase modulation of the carrier signal. The sloping portion of the self noise is the near-carrier noise, while the flat portion of the noise further from the carrier is the phase noise floor level or white noise level. The self noise changes from the near-carrier noise to the phase noise floor level at an offset frequency $f_m \approx 1/2 \pi\tau$, where $\tau$ is the oscillator loop group delay in seconds, (i.e., the 3 dB bandwidth). The slope of the near-carrier noise measured in dBc (e.g., 30 dB per decade) is referred to as the flicker-of-frequency noise. In the typical oscillator, an amplifier amplifies the signal appearing at the output of the resonator. The input signal level to the amplifier and the noise figure of the amplifier substantially determine the oscillator output signal phase noise floor level.

An oscillator may be configured and/or analyzed as a positive feedback loop circuit in which the sustaining stage contains the feedforward amplifier, and the resonator is installed in the positive feedback path from the amplifier output to the amplifier input. In such circuits, a necessary condition for the oscillation is the maintenance, at the oscillator operating signal frequency, of $2\pi N$ radians or 360N degrees total closed loop phase shift, where N is an integer. Since the resonator is the primary frequency-determining element in the oscillator, a change in the resonator frequency (due, for example, to resonator exposure to vibration and/or resonator self-noise) is accompanied by a near-identical change in the oscillator signal frequency.

When the amplifier portion of the oscillator circuit experiences a phase change (due, for example, to amplifier flicker-of-phase and white phase noise), the oscillator must change frequency in order to maintain constant loop phase shift. The amount of oscillator signal frequency perturbation (i.e., FM noise) resulting from a given amount of amplifier phase perturbation (i.e., PM noise) is a function of the oscillator loop phase versus frequency slope or group delay. The loop group delay is almost entirely a function of, and is proportional to, the resonator loaded Q. Thus, the resonator Q can be considered a measure of the resonator's ability to minimize the conversion of amplifier PM noise to oscillator signal FM noise. This explains why lower noise signals are generated using oscillators employing high Q resonators (i.e., resonators yielding high values of loop group delay). The effect of the conversion of oscillator amplifier phase noise to oscillator signal frequency noise is most pronounced in the near-carrier portion of the oscillator signal spectrum and occurs primarily in the region either side of the carrier signal within the resonator transmission response passband.

A comparison between conventional BAWR and SAWR oscillator performance shows that, in general, SAWR oscillators operate at higher frequencies and exhibit lower phase noise floor levels. BAWR oscillators, on the other hand, generally exhibit lower near-carrier and flicker-of-frequency noise levels, and are less sensitive to vibration. These oscillator performance differences are directly related to corresponding differences in resonator characteristics. With regard to SAWR oscillators, low phase noise floor levels result from a relatively higher SAWR drive level capability. For instance, a conventional SAWR may have a maximum drive level of 20–100 mW, while a conventional BAWR may have a maximum drive level of only 1 mW.

Of further interest, the product between the frequency and the resonator Q, referred to as the frequency-Q product, remains fairly constant for quartz BAWR and SAWR. Since BAWR oscillators operate at lower frequencies (e.g., HF and VHF) than do SAWR oscillators (e.g., UHF), BAWR oscillators have proportionally higher Qs. These lower Qs and/or relatively higher resonator short-term frequency instability for SAWR contribute to the relatively higher flicker-of-frequency and near-carrier noise levels in SAWR oscillators.

U.S. Pat. No. 4,851,790 entitled "CRYSTAL CONTROLLED OSCILLATOR EXHIBITING REDUCED LEVELS OF CRYSTAL-INDUCED LOW FREQUENCY NOISE, VIBRATION SENSITIVITY AND CIRCUIT TEMPERATURE RISE", issued Jul. 25, 1989, by Driscoll (the inventor of the subject application), describes a technique for improving quartz crystal oscillator vibration sensitivity, near-carrier noise level, and phase noise floor level through the use of multiple, series connected resonators. In one embodiment of U.S. Pat. No. 4,851,790, four 80 Mhz, 3rd overtone, SC-cut resonators are connected in series, and have a net effective Q identical to that of a single resonator. This series arrangement of the BAWRs improved the near-carrier and phase noise floor levels, and the vibration sensitivity of the oscillator.

Unfortunately, applying this technique to higher frequency resonators, such as SAWR, proved difficult using current technology. To minimize the phase noise floor level, each SAWR would require a drive level on the order of 100 mW. Accordingly, combining four SAWR in series would require the use of a sustaining stage amplifier providing a drive level of more than 400 mW, and exhibiting an exceptionally low flicker-of-phase noise. Current technology does not provide amplifiers which meet these requirements. Furthermore, crystal resonators such as BAWR and SAWR have a certain amount of parasitic capacitance. As is well known, the lower the operating frequency of the resonator, the easier (i.e., the more coarsely) the parasitic capacitance can be tuned out. At the high frequency operating level of, for example SAWRs, tuning out the parasitic capacitance proves quite difficult since a small degree of mistuning has a much more detrimental effect at high frequency. As a result, cost and manufacturing factors prohibit exact tuning out of the parasitic capacitance of high frequency crystal resonators. Use of variable reactance (i.e., trimmer capacitors) to accomplish exact tuning is not practical due to their vibration sensitivity.

SUMMARY OF THE PRESENT INVENTION

An object of the present invention is to provide an oscillator, formed of at least two high frequency resonators, having relatively low phase noise.

A further object of the present invention is to provide an oscillator, formed of at least two high frequency resonators, having improved flicker-of-frequency and near-carrier noise levels.

An additional object of the present invention is to provide an oscillator, formed of at least two high frequency resonators, having an improved loop group delay.

Another object of the present invention is to provide an oscillator, formed of at least two high frequency resonators, having improved vibration insensitivity.

A still further object of the present invention is to provide an oscillator, formed of at least two high frequency resonators, having an improved phase noise floor level.

Another object of the present invention is to provide a method of generating a high frequency oscillator signal having relatively low phase noise.

A further object of the present invention is to provide a method of generating a high frequency oscillator signal having improved flicker-of-frequency and near-carrier noise levels.

A still further object of the present invention is to provide a method of generating a high frequency oscillator signal having an improved phase noise floor level.

These and other related objectives are achieved by providing an oscillator having at least two high frequency resonator stages connected in series and forming a closed loop signal path. Each of the high frequency resonator stages includes at least one high frequency resonator and an amplifier connected to an output of the high frequency resonator.

The oscillator may further include a phase shifter connected between two of the high frequency resonator stages to achieve a closed loop phase shift of N(360) degrees, where N is an integer. Furthermore, the high frequency resonator may be an acoustic resonator such as a surface acoustic wave resonator (SAWR).

Additionally, these an other related objectives are achieved by providing a method for producing at least one high frequency oscillator output signal having low phase noise wherein the method comprises the steps of (a) generating at least first and second high frequency signals using at least corresponding first and second high frequency resonators; (b) amplifying the first and second high frequency signals; (c) dividing each of the amplified first and second high frequency signals into first and second signal portions; (d) outputting at least one of the first signal portions as the high frequency oscillator output signal; and (e) supplying the second signal portion of the amplified first high frequency signal to an input of the second high frequency resonator and supplying the second signal portion of the amplified second high frequency signal to an input of the first high frequency resonator to form a closed loop signal path.

The method may further include the step of (f) phase shifting one of the second signal portions prior to input by a non-corresponding one of the first and second high frequency resonators to achieve a closed loop phase shift of N(360) degrees, where N is an integer. Furthermore, the high frequency resonators may be acoustic resonators such as surface acoustic wave resonators (SAWR).

Other objects, features, and characteristics of the present invention; methods, operation, and functions of the related elements of the structure; combination of parts; and economies of manufacture will become apparent from the following detailed description of the preferred embodiments and accompanying drawings, all of which form a part of this specification, wherein like reference numerals designate corresponding parts in the various figures.

DETAILED DESCRIPTION OF EMBODIMENTS

Figure 1:
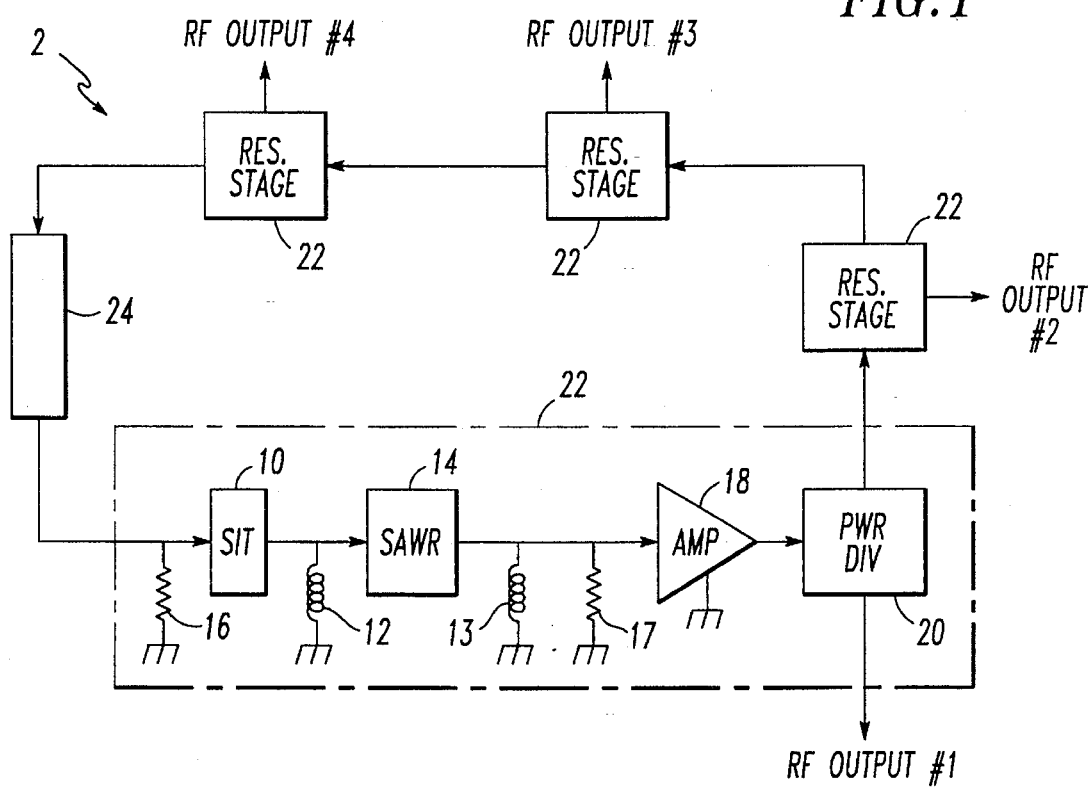
FIG. 1 illustrates one embodiment of an oscillator according to the present invention.

FIG. 1 illustrates one embodiment of an oscillator 2 according to the present invention. The oscillator 2 shown in FIG. 1 includes four resonator stages 22 connected in series with a phase shifter 24. Each resonator stage 22 includes a SAWR 14, and a SAWR center frequency adjust or select-in-test reactance (SIT) 10 connected to the input of the SAWR 14. Each resonator stage 22 further includes a resistor 16 connected between the input of the SIT 10 and ground, an inductance 12 connected between the input of the SAWR 14 and ground, an inductance 13 connected between the output of the SAWR 14 and ground, and a resistor 17 connected between the output of the SAWR 14 and ground.

Each resonator stage 22 also includes an amplifier 18 connected to the output of the SAWR 14, and a power divider 20 which receives the output of the amplifier 18. A first output of the power divider 20 supplies one of the RF outputs of the oscillator 2, while a second output of the power divider 20 is connected to the input of the SIT 10 in the next resonator stage 22.

The SAWR 14 for each resonator stage 22 is designed and manufactured to have a resonant response at the nominal oscillator operating frequency. For testing purposes SAWRs designed for use at 320 Mhz signal were chosen. Due to manufacturing errors, however, the frequency of each SAWR 14 may deviate from the expected 320 Mhz. The SIT 10 associated with each SAWR 14 corrects for the manufacturing errors in each associated SAWR 14, by tuning the associated SAWR 14 to the desired operating frequency (e.g., 320 Mhz in the test oscillator). The SIT 10 may be any well known device or component for tuning a high frequency resonator such as a capacitor or inductor, and the tuning need not be exact. The SIT 10 is typically to place the resonator output signal within the 1 dB bandwidth of the bandpass transmission response of the resonator stage 22.

The resistors 16 and 17 added to the input and output of the SAWR 14, respectively, serve to match the impedance of the SAWR 14 to the characteristic impedances of the power divider 20, in the previous resonator stage 22, and the amplifier 18. Typically, both the amplifier 18 and the power divider 20 have characteristic impedances of 50 ohms. The inductances 16 and 17 serve to coarsely tune out the SAWR interdigital transducer capacitance (IDT capacitance). Finely tuning out the parasitic capacitances is not required in the oscillator according to the present invention.

The amplifier 18 amplifies the output of the SAWR 14 by a desired gain, and outputs the amplified signal to the power divider 20. The amplifier 18 may be any well known amplifier which can supply the desired drive level for the SAWR 14. The power divider 20, in this embodiment, is a two-way power divider. A first divided portion of the amplified signal is supplied as an RF output, while a second divided portion of the amplified signal is output to the SIT 10 of the next resonator stage 22. The power divider 20 may be either a zero degree or 180 degree power divider since the appropriate loop phase shifting is added using phase shifter 24.

The phase shifter 24 alters the loop phase shift, and thus, the frequency at which the required, 360N degrees loop phase shift occurs. Adjusting the loop phase shift has the effect, in the oscillator, of changing the output signal frequency when the required loop phase shift is obtained within the resonator stage 22 transmission response passband where there is sufficient per-stage gain to initiate oscillation (if the required loop phase shift does not occur within the resonator stage passband, the oscillator will not start up). The correct setting for the phase shifter 24 can be predetermined by breaking the loop open, driving the circuit from an external signal generator and measuring the loop phase shift. Alternatively, the phase shift can be coarsely adjusted until oscillation is initiated and then finely adjusted to give the desired operating signal frequency. Any well known phase shifter may be used, such as a predetermined length of coaxial cable. While shown positioned between the resonator stages 22, the phase shifter may be disposed in one of the resonator stages 22. It should be understood that the above described technique requires a reasonable degree of frequency tracking between the individual SAWRs 14 overtime and temperatures. For example, an allowable phase shift change between the resonator stages 22 on the order of 0.1 radians would correspond to a SAWR tracking requirement (assuming 320 Mhz SAWR) of $df/f_o=5$ ppm where df is the allowable mistrack between SAWRs and fo is the SAWR center frequency. This implies use of ovenized, low ageing rate resonators. The degree of allowable mistrack is related to resonator group delay, and is larger for higher frequency (lower delay) devices. For example, three times higher (15 ppm) mistrack would be allowed between 1 Ghz SAWRs, which typically exhibit ten times lower loop group delay (three times lower Q) compared to the 320 Mhz SAWRs.

While the embodiment of the present invention described above includes four resonator stages 22, the present invention is not limited to four stages. Instead, the number of resonator stages may be as few as two or three, or much greater than four. Additionally, the number of SAWR 14 per resonator stage 22 is not limited to one. Furthermore, while a SAWR was used as the high frequency resonator, any other high frequency resonator, such as a dielectric resonator, may be used. Additionally, the high frequency resonator of the present invention is not limited to an acoustic or crystal resonator.

As FIG. 1 illustrates, the oscillator 2 according to the present invention provides the added benefit, depending on the number of the resonator stages 22, of multiple RF outputs. Combining these outputs in various ways can achieve further noise reduction since the phase noise floor level component of each output is uncorrelated due to the frequency selectivity (i.e., bandpass transmission response) of each (per resonator stage 22) SAWR. Put another way, the noise of the previous resonator stage 22 (amplifier 18) is "filtered" by the following resonator stage 22 SAWR loop transmission response group delay, and is therefore not present in the RF output of the following resonator stage 22. Thus, vector amplitude summing, for example, two RF outputs using a power combiner provides an additional 3 dB reduction in the phase noise floor level of the combined RF outputs. Additionally, frequency summing, for example, two RF outputs using a mixer or multiplier also provides an additional 3 dB reduction in the phase noise floor level of the combined RF outputs. Similarly, amplitude or frequency summing of four RF outputs provides an additional 6 dB noise floor reduction.

Next, additional advantages of the present invention will be discussed, and for purposes of this discussion the four resonator stage oscillator 2 of FIG. 1 will be used. For testing purposes, a 320 Mhz SAWR manufactured by SAW-TEK was chosen as the SAWR 14, an appropriate SIT 10 was used to correct the carrier frequency of the SAWR 14 to 320 Mhz, 240 ohm resistors were chosen as the resistors 16 and 17, inductors having an inductance of 0.068 uH were chosen as the inductors 12 and 13, an AVANTEK UTC-518 amplifier was chosen as the amplifier 18, and a two-way, zero degree power divider was chosen as the power divider 20.

Figure 2:
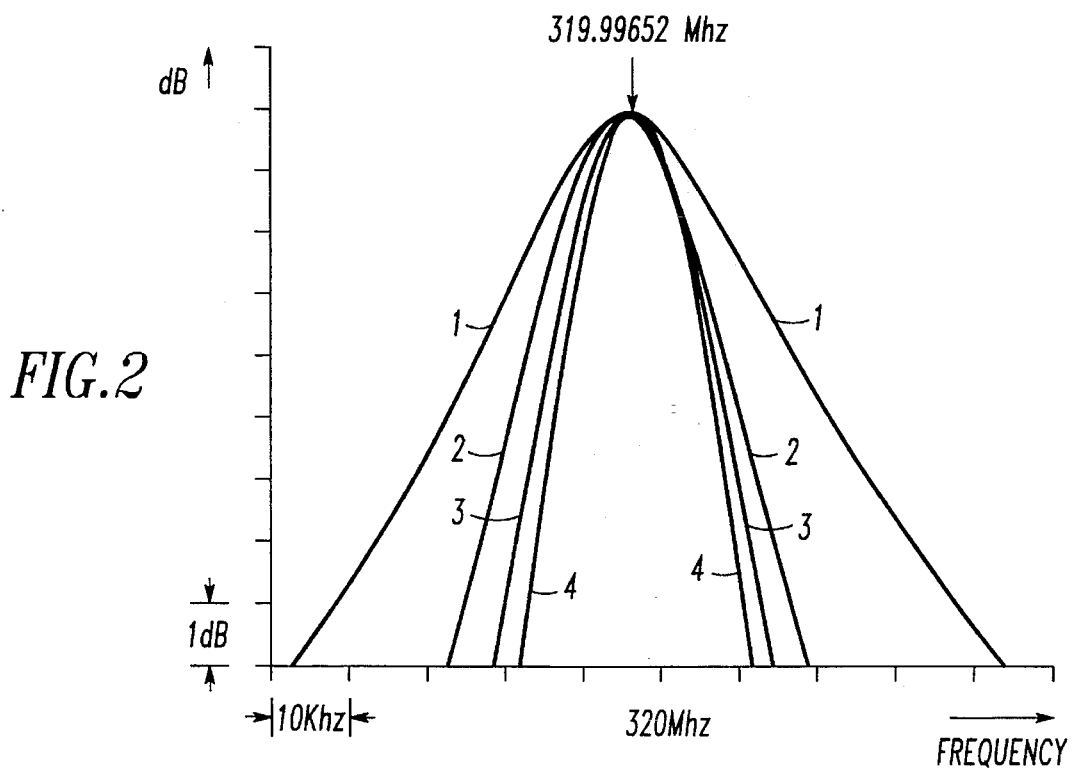
FIG. 2 illustrates the open loop response for one, two, three, and four cascaded resonator stages.

FIG. 2 illustrates the open loop response for one, two, three, and four cascaded resonator stages. As illustrated in FIG. 2, the oscillator according to the present invention achieves a significant reduction in near-carrier and flicker-of-frequency noise levels. The per stage and all four stages small signal gain was on the order of 1.5 dB and 6 dB, respectively.

Figure 3:
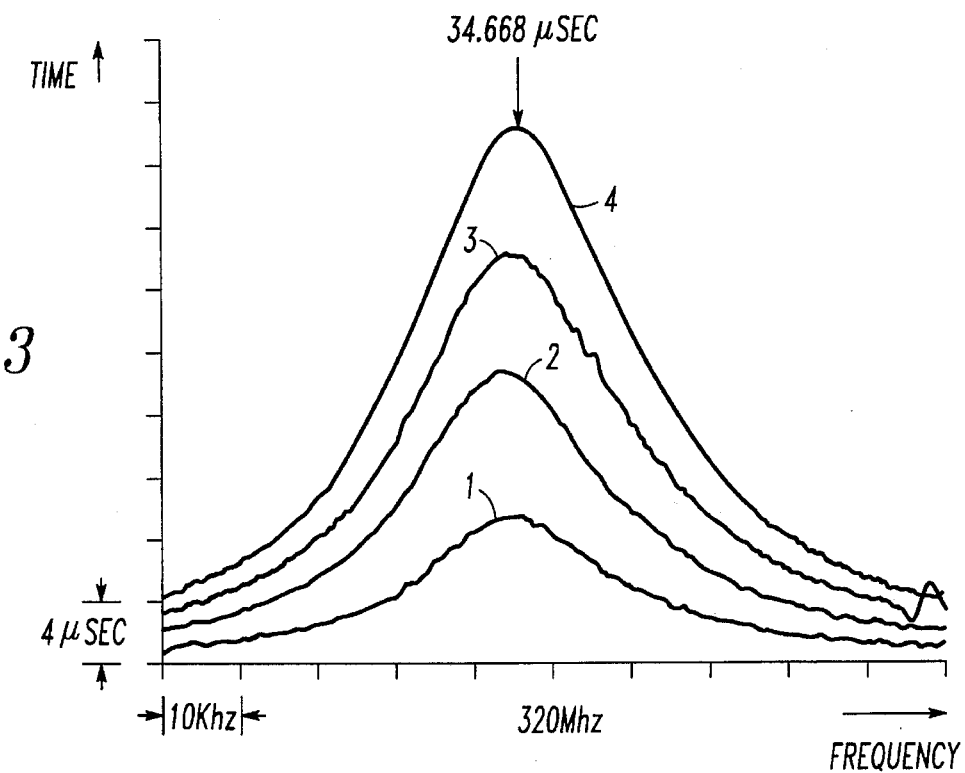
FIG. 3 illustrates the open loop group delay for one, two, three, and four cascaded resonator stages.

FIG. 3 illustrates the open loop group delay for one, two, three, and four cascaded resonator stages. As illustrated in FIG. 3, the oscillator according to the present invention significantly improves the loop transmission response group delay. The per stage and all four stages loop group delay was on the order of 8.5 usec and 34 usec, respectively.

The use of multiple resonator stages 22 also reduces the oscillator signal near-carrier noise. Firstly, the increase in loop group delay reduces the degree of the conversion of total resonator stage amplifier phase noise (occurring on either side of the carrier signal frequency and within the resonator passband) to oscillator signal frequency noise by 20l ogM, where M is equal to the number of resonator stages (and is also equal to the increase in loop group delay obtained by using M resonator stages). Because M amplifiers are also used, however, a 10l ogM increase in net loop in-band phase noise occurs. Thus, the net reduction in near-carrier noise due to amplifier noise is the difference between the two (i.e., 6 dB when M=4). Secondly, since individual SAWR self noise is uncorrelated, but multiple SAWRs are used, a 10l ogM decrease in SAWR flicker-of-frequency or self noise is obtained, where M equals the total number of resonators included in the oscillator loop.

Figure 4:
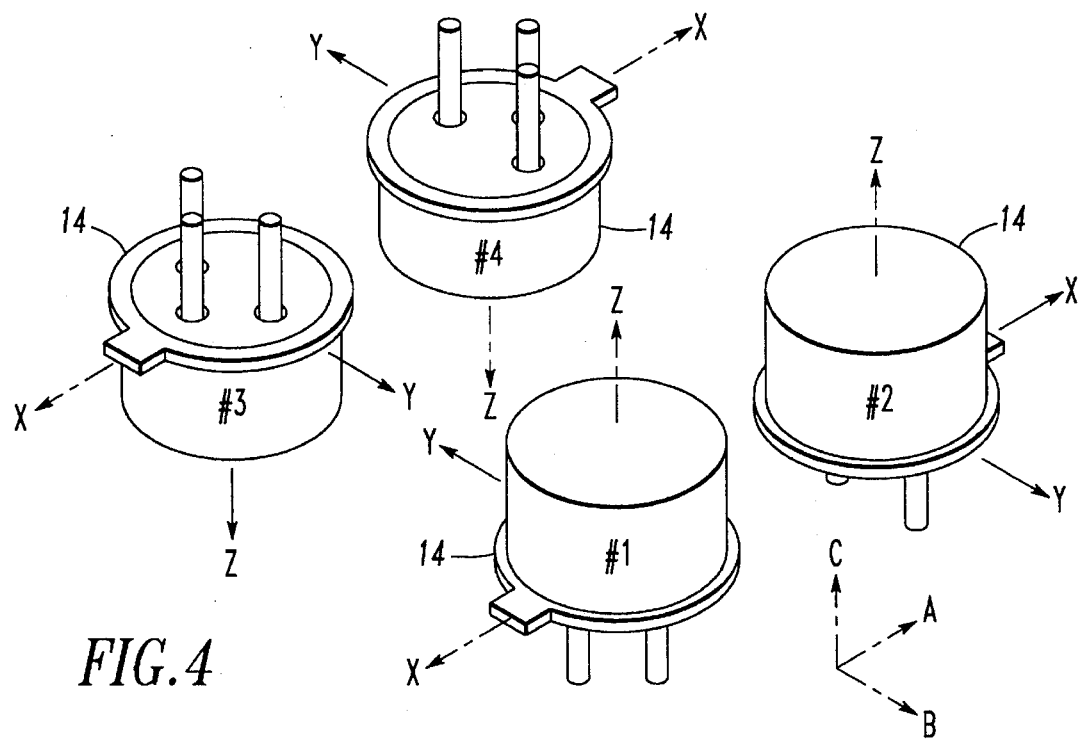
FIG. 4 illustrates the relative orientation of four SAWR forming an oscillator according to the present invention.

Mounting the individual resonators (SAWRs 14 in the embodiment of FIG. 1) in the manner described in U.S. Pat. No. 5,250,871 entitled "LOW VIBRATION SENSITIVITY CRYSTAL RESONATOR ARRANGEMENT", issued Oct. 5, 1993, by Driscoll et al. (the inventor of the subject application), achieves partial cancellation of vibration sensitivity in all three axes. Accordingly, to the extent necessary, applicant hereby incorporates by reference the entirety of the disclosure of U.S. Pat. No. 5,250,871. FIG. 4 illustrates one embodiment for mounting the individual resonators of the present invention according to U.S. Pat. No. 5,250,871. Each numbered SAWR 14 corresponds to the SAWR 14 in each resonator stage 22 outputting the like numbered RF OUTPUT in FIG. 1. The X, Y and Z axis indicators for each SAWR 14 show the relative orientation of the crystalline axes of each SAWR 14. The A, B, and C coordinate axes represent the vibration coordinate axes and show the direction of external (i.e., shake table) vibration. The amount of vibration sensitivity reduction achieved by the resonator orientations shown in FIG. 4 depends on the uniformity of the vibration sensitivity vector (magnitude and direction) for each resonator. The overall, effective vibration sensitivity vector for the four resonators is the vector sum of one-fourth (¼) of each individual resonator vibration sensitivity vector. Therefore, if three of the four resonators had zero magnitude vibration sensitivities, the overall vibration sensitivity of the four resonator combination would be one-fourth that of the remaining vibration-sensitive resonator.

Figures 9, 10:
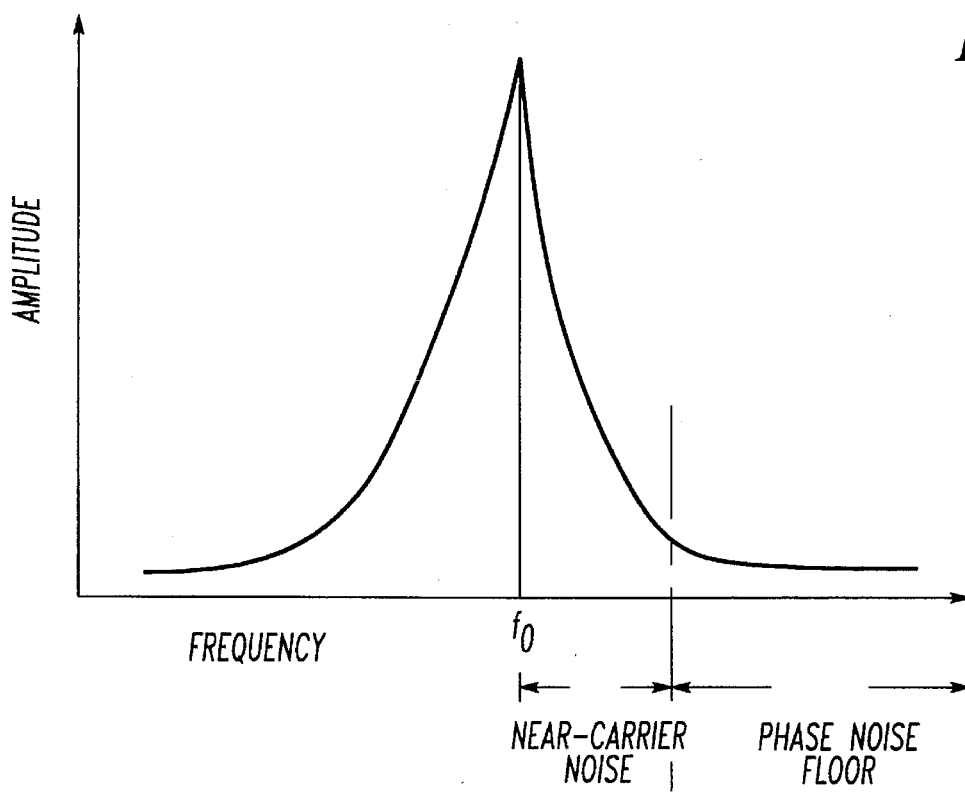
FIG. 9 illustrates the frequency spectrum of the output of a convention oscillator having a crystal resonator.
FIG. 10 illustrates a table showing the measurements of each individual SAWR vibration sensitivity vector in all three axes.

FIG. 10 illustrates a table showing the measurement of each individual SAWR vibration sensitivity vector in all three axes. The tests consisted of measuring the vibration-induced, phase modulation sideband appearing on a carrier signal passed through the SAWR mounted on a shake table in a passive transmission test fixture. Continuous wave test tones of 50 hz, 100 hz, and 200 hz were used. The measurement results indicate that, for all four resonators, the vibration sensitivity vector direction was virtually orthogonal to the SAWR die surface, and the vector magnitude was fairly uniform. The table illustrated in FIG. 10 also shows net vibration sensitivity of the four SAWR oriented as shown in FIG. 4 and indicates a significant reduction in net vibration sensitivity. For the four SAWR net vibration sensitivity measurement, a vibration-induced carrier signal FM sideband level was measured at the test tone frequencies discussed above for the closed loop oscillator.

To determine SAWR oscillator phase noise floor levels, an HP (Hewlett Packard) 11740A Phase Noise Measurement System (hereinafter the "HP system") was used. The HP system performs phase noise measurements by locking the output of a tunable reference signal generator or reference oscillator to the device under test oscillator signal. Since, the inventor only had available reference signal generators which generated a 640 Mhz signal, the inventor prepared the test circuit 46 shown in FIG. 5 to generate a 640 Mhz device under test oscillator signal using the oscillator according to the present invention.

Figure 6:
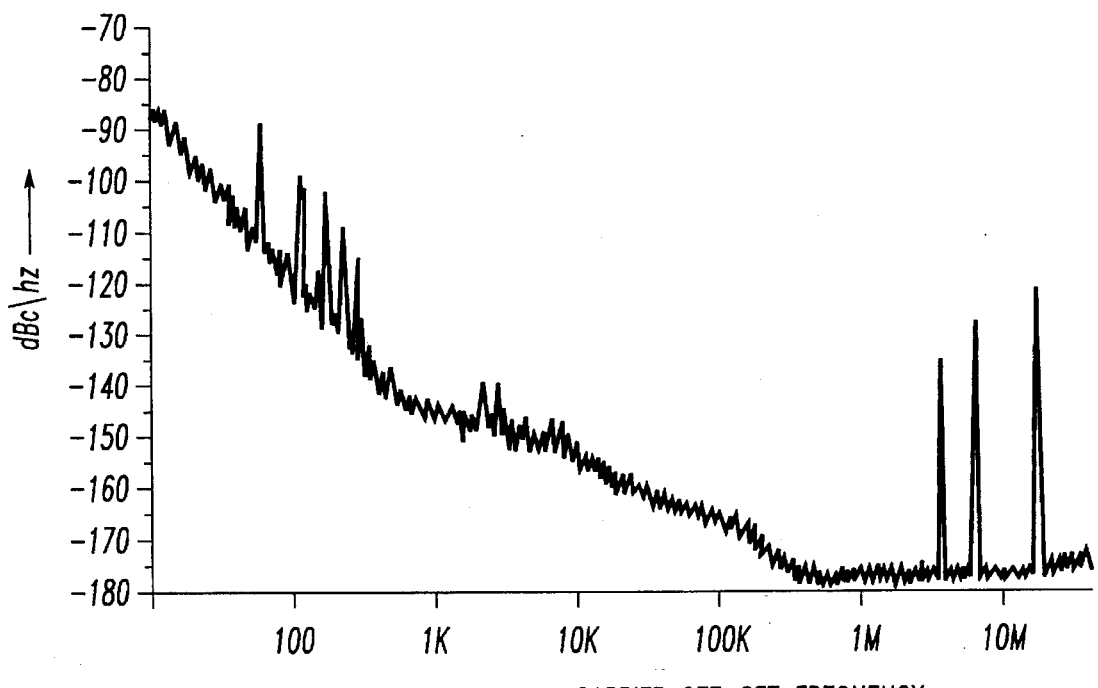
FIG. 6 illustrates the phase noise measurement for a reference oscillator.

Each reference signal generator consisted of a low noise 80 Mhz (four crystal oscillator) and a times-eight frequency multiplier incorporating an intermediate stage SAWR bandpass filter at 320 Mhz and a 300 Khz, 10 dB insertion loss, ceramic dielectric, 640 Mhz bandpass filter inserted at the signal generator output. The inventor first made phase noise measurements using two of the reference signal generators as both the reference oscillator and test oscillator, respectively. The 640 Mhz bandpass filters were used to filter the signal generator output signal and thus reduce the phase noise floor level at carrier offset frequencies occurring outside the filter bassband. FIG. 6 illustrates the phase noise measurement result using the two, near-identical, reference signal generators. As shown in FIG. 6, the measured signal floor level is clearly reduced outside the filter passband at carrier offset frequencies beyond several hundred Khz.

Figure 5:
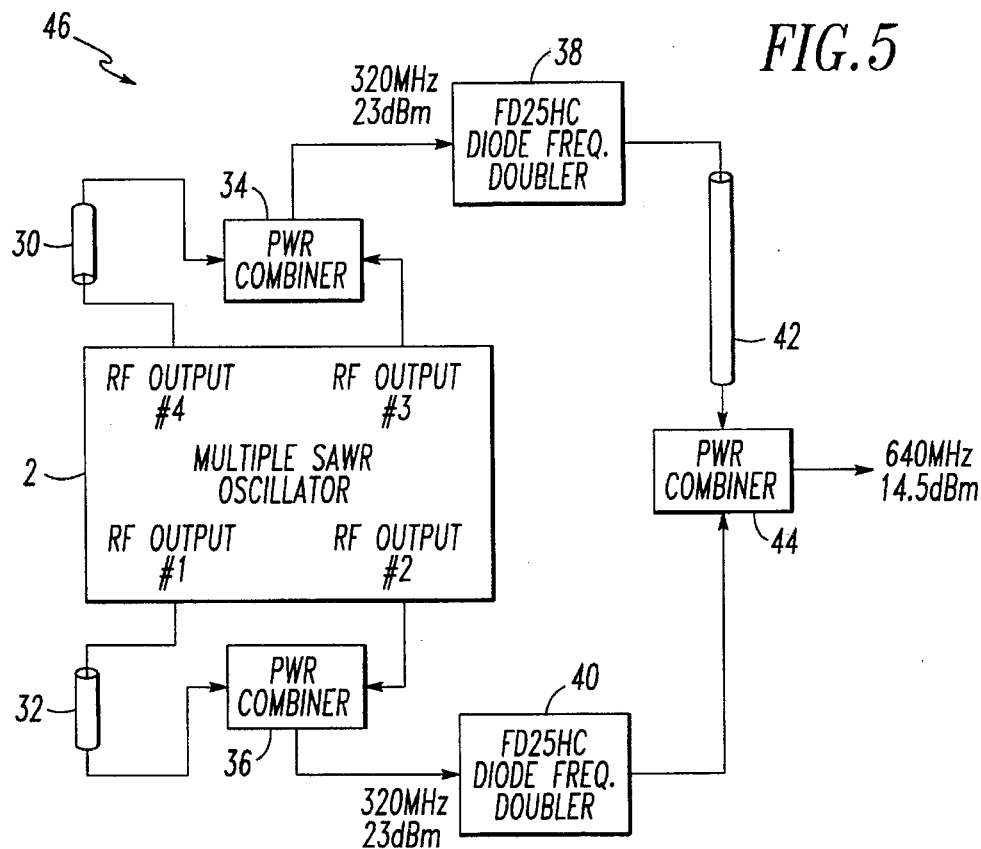
FIG. 5 illustrates a test circuit for testing the characteristics of the oscillator according to the present invention.

As discussed above, the test circuit 46 of FIG. 5 was created to produce a 640 Mhz signal using the oscillator according to the present invention. As shown in FIG. 5, a power combiner 34 combines the output of the third resonator stage 22 and the fourth resonator stage 22 of the oscillator 2. A phase shifter 30 is disposed between the output of the fourth resonator stage 22 and the power combiner 34. The phase shifter 30 phase shifts the output of the fourth resonator stage 22 to provide for maximum output from the power combiner 34. In the test circuit of FIG. 5, the power combiner 34 and a power combiner 36 (described below) produced 320 Mhz signals at 23 dBm. The phase shifter 30 could, instead, be disposed between the output of the third resonator stage 22 and the power combiner 34. The phase shifter 30 may be any well known phase shifter such as a predetermined length of coaxial cable.

Since the phase shifter 32 and the power combiner 36 are connected and operate in the same manner as the phase shifter 30 and the power combiner 34 to combine the outputs of the first and second resonator stages 22, the connection and operation of these components will not be described. A frequency doubler 38 doubles the frequency of the output from the power combiner 34. Likewise, the frequency doubler 40 doubles the frequency of the output of the power combiner 36. A diode frequency doubler, model number FD25HC produced by Watkins Johnson, Inc., was used as the frequency doublers 38 and 40.

A power combiner 44 combines the output of the frequency doubler 38 and the frequency doubler 40. A phase shifter 42 is disposed between the output of the frequency doubler 38 and the power combiner 44. The phase shifter 42 phase shifts the output of the frequency doubler 38 to provide for maximum output from the power combiner 44.

In the test circuit 46 of FIG. 5, the power combiner 44 produced a 640 Mhz signal at 14.5 dBm. The phase shifter 42 could, instead, be disposed between the output of the frequency doubler 40 and the power combiner 44. The phase shifter 42 may be any well known phase shifter such as a predetermined length of coaxial cable.

Figure 7:
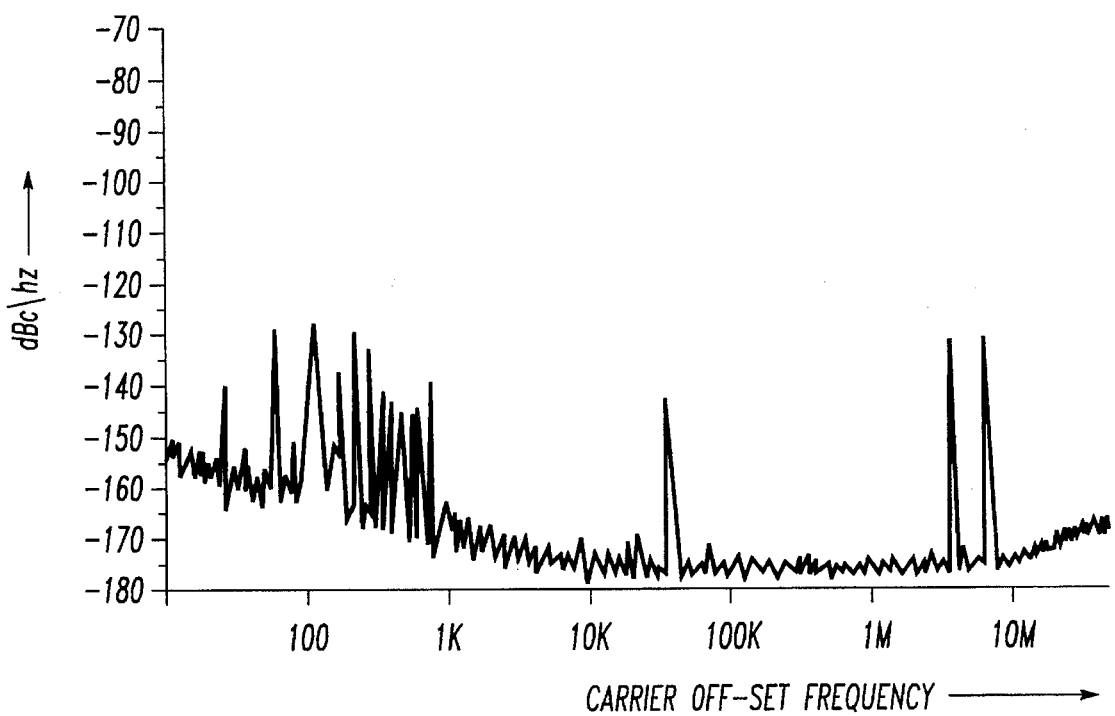
FIG. 7 illustrates the phase noise of the HP11740A Phase Noise Measurement System.

The HP system introduces phase noise into the measurements made using the system. Therefore, to accurately determine the phase noise of the test circuit 46, the phase noise of the HP system had to be determined. To determine the phase noise of the HP system, the output of one of the reference signal generators was connected to both the reference signal and test signal inputs of the HP system. FIG. 7 illustrates the phase noise measurements made using this set-up. Consequently, FIG. 7 illustrates the phase noise of the HP system.

Figure 8:
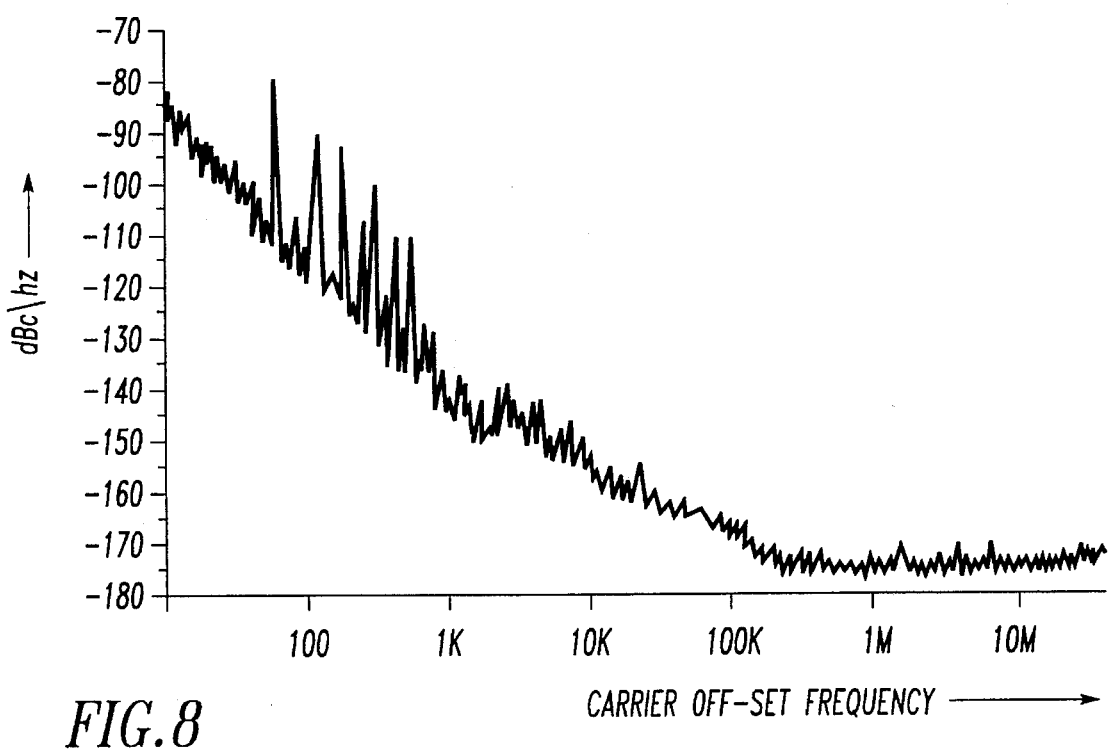
FIG. 8 illustrates the phase noise for the test circuit illustrated in FIG. 5.

Next, the reference signal generator and the output of the test circuit 46 were connected to the HP system. FIG. 8 illustrates the phase noise of the test circuit 46 measured by the HP system. A comparison of FIGS. 6, 7, and 8 indicates that in the near-carrier region (fm≦100 hz, where fm refers to the frequency off-set from the carrier), the test circuit 46 is the dominant source of flicker-of-frequency noise. At the moderate carrier offset region (100 hz≦fm≦300 Khz), the phase noise of the reference signal generator dominates. In the high frequency offset, phase noise floor region (fm>300 Khz), the phase noise floor level (−175 dBc/hz) is partially due to the test circuit 46 (−179 dBc/hz) and partially due to the resolution of the HP system (−177 dBc/hz).

Based on the results depicted in FIGS. 6 and 8, the phase noise of the oscillator 2, prior to frequency doubling, can be described by a flicker-of-frequency component on the order of $S_y(f)=8\times10^{-24}/f$ (−124 dBc/hz at 100 hz offset frequency). The effective phase noise floor level, including frequency doublers 38, 40, is on the order of −185 dBc/hz.

As the above demonstrates, the oscillator according to the present invention achieves exceptionally low phase noise for a high frequency oscillator. The oscillator according to the present invention also achieves improved group delay, resulting in lower near-carrier noise levels due to the improved suppression of amplifier flicker-of-phase noise. The present invention further provides for improved vibration insensitivity, and avoids the use of a single very high power level sustaining stage amplifier. Additional benefits are achieved by the provision of multiple outputs which, through summation or multiplication, can be used to achieve further noise reduction.

While the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed:

1. An oscillator, comprising:
   at least two high frequency resonator stages connected in series and forming a closed loop signal path; and
   each of said high frequency resonator stages including, at least one high frequency resonator, and
   an amplifier connected to an output of said high frequency resonator.

2. The oscillator of claim 1, further comprising:
   a phase shifter connected in series between two of said high frequency resonator stages, said phase shifter providing a N(360) degree closed loop phase shift at an operating frequency of said oscillator, where N is an integer.

3. The oscillator of claim 1, wherein at least one of said high frequency resonator stages includes a power divider connected to an output of said amplifier, said power divider having at least first and second outputs, said first output of said power divider providing an output of said oscillator, and said second output of said power divider connected to an input of a next one of said high frequency resonator stages.

4. The oscillator of claim 1, further comprising:
   a power combiner for combining output from said first outputs of said high frequency resonator stages.

5. The oscillator of claim 1, further comprising:
   multiplying means for multiplying output from said first outputs of said high frequency resonator stages.

6. The oscillator of claim 1, wherein said high frequency resonator in said high frequency resonator stages is an acoustic resonator.

7. The oscillator of claim 1, wherein said high frequency resonator in said high frequency resonator stages is a surface acoustic wave resonator (SAWR).

8. The oscillator of claim 1, comprising four high frequency resonator stages.

9. The oscillator of claim 8, wherein each of said four high frequency resonator stages includes a power divider connected to an output of said amplifier, said power divider having at least first and second outputs, said first output of said power divider providing an output of said oscillator, and said second output of said power divider connected to an input of a next one of said four high frequency resonator stages.

10. The oscillator of claim 9, wherein
    said high frequency resonator in each of said four high frequency resonator stages is an acoustic resonator having orthogonal crystallographic axes;
    a first pair of said acoustic resonators are positioned so that two of the crystallographic axes of one of said first pair are in antiparallel relationship with two of the crystallographic axes of the other one of said first pair; and
    a second pair of said acoustic resonators are positioned so that two of the crystallographic axes of one of said second pair are in antiparallel relationship with two of the crystallographic axes of the other one of said second pair, and so that a third crystallographic axis of each of said first pair is in antiparallel relationship with a third crystallographic axis of each of said second pair.

11. The oscillator of claim 10, wherein said crystal resonator in each of said four high frequency resonator stages is a surface acoustic wave resonator (SAWR).

12. A method for producing at least one high frequency oscillator signal having low phase noise, comprising:
    (a) generating at least first and second high frequency signals using at least corresponding first and second high frequency resonators;
    (b) amplifying said first and second high frequency signals;
    (c) dividing each of said amplified first and second high frequency signals into first and second signal portions;
    (d) outputting at least one of said first signal portions as said high frequency oscillator signal; and
    (e) supplying said second signal portion of said amplified first high frequency signal to an input of said second high frequency resonator and supplying said second signal portion of said amplified second high frequency signal to an input of said first high frequency resonator to form a closed loop signal path.

13. The method of claim 12, further comprising:

(f) phase shifting one of said second signal portions prior to input by a non-corresponding one of said first and second high frequency resonators to achieve a closed loop phase shift of N(360) degrees at an operating frequency of said oscillator.

14. The method of claim 12, further comprising:

(f) combining, in a power combiner, said first signal portions.

15. The method of claim 12, further comprising:

(f) multiplying said first signal portions.

16. The method of claim 12, wherein said step (a) generates said first and second high frequency signals using at least first and second acoustic resonators.

17. The method of claim 12, wherein said step (a) generates said first and second high frequency signals using at least first and second surface acoustic wave resonators (SAWR).

18. The method of claim 12, wherein said step (a) generates four high frequency signals using four corresponding high frequency resonators.

19. The method of claim 18, wherein each of said four high frequency resonators is an acoustic resonator having orthogonal crystallographic axes;

a first pair of said acoustic resonators are positioned so that two of the crystallographic axes of one of said first pair are in antiparallel relationship with two of the crystallographic axes of the other one of said first pair; and a second pair of said acoustic resonators are positioned so that two of the crystallographic axes of one of said second pair are in antiparallel relationship with two of the crystallographic axes of the other one of said second pair, and so that a third crystallographic axis of each of said first pair is in antiparallel relationship with a third crystallographic axis of each of said second pair.

20. The method of claim 19, wherein said step (a) generates said four high frequency resonator signals using four corresponding surface acoustic wave resonators (SAWR).

* * * * *